(12) United States Patent
Siddiqui et al.

(10) Patent No.: US 7,316,977 B2
(45) Date of Patent: Jan. 8, 2008

(54) CHEMICAL-MECHANICAL PLANARIZATION COMPOSITION HAVING KETOOXIME COMPOUNDS AND ASSOCIATED METHOD FOR USE

(75) Inventors: Junaid Ahmed Siddiqui, Richmond, VA (US); Timothy Frederick Compton, Casa Grande, AZ (US)

(73) Assignee: Air Products and Chemicals, Inc., Allentown, PA (US)

( * ) Notice: Subject to any disclaimer, the term of this patent is extended or adjusted under 35 U.S.C. 154(b) by 0 days.

(21) Appl. No.: 11/508,427

(22) Filed: Aug. 23, 2006

(65) Prior Publication Data

US 2007/0049025 A1    Mar. 1, 2007

Related U.S. Application Data

(60) Provisional application No. 60/711,241, filed on Aug. 24, 2005.

(51) Int. Cl.
*H01L 21/302* (2006.01)
*H01L 21/461* (2006.01)
*C11D 7/32* (2006.01)
*C09K 13/00* (2006.01)

(52) U.S. Cl. ............... 438/693; 438/690; 438/692; 510/175; 252/79.1

(58) Field of Classification Search .......... 438/691, 438/692, 693, 694; 257/E21.23, E21.304
See application file for complete search history.

(56) References Cited

U.S. PATENT DOCUMENTS

| | | | |
|---|---|---|---|
| 5,085,694 A * | 2/1992 | Cifuentes ............... 106/3 |
| 5,770,095 A | 6/1998 | Sasaki et al. |
| 6,117,783 A | 9/2000 | Small et al. |
| 6,193,790 B1 | 2/2001 | Tani |
| 6,313,039 B1 | 11/2001 | Small et al. |
| 6,454,819 B1 | 9/2002 | Yano et al. |
| 6,582,761 B1 | 6/2003 | Nishimoto et al. |
| 6,585,825 B1 * | 7/2003 | Skee ............... 134/3 |
| 6,599,370 B2 * | 7/2003 | Skee ............... 134/3 |
| 6,635,186 B1 | 10/2003 | Small et al. |
| 6,645,051 B2 | 11/2003 | Sugiyama et al. |
| 6,730,157 B2 * | 5/2004 | Steinert et al. ............. 106/263 |
| 6,755,721 B2 | 6/2004 | Ward et al. |
| 6,777,335 B2 | 8/2004 | Hasegawa |
| 6,852,632 B2 | 2/2005 | Wang et al. |
| 6,866,792 B2 | 3/2005 | Small et al. |
| 6,869,336 B1 | 3/2005 | Hardikar |
| 6,918,820 B2 | 7/2005 | Smith et al. |
| 2002/0111024 A1 | 8/2002 | Small et al. |
| 2003/0137052 A1* | 7/2003 | Horiuchi et al. ............. 257/758 |
| 2003/0162399 A1 | 8/2003 | Singh |
| 2003/0176068 A1 | 9/2003 | Small et al. |
| 2004/0021125 A1* | 2/2004 | Taiji et al. ............. 252/2 |
| 2004/0072439 A1 | 4/2004 | Small et al. |
| 2004/0118051 A1* | 6/2004 | Shiho et al. ............. 51/295 |
| 2004/0134873 A1 | 7/2004 | Yao et al. |
| 2004/0144755 A1 | 7/2004 | Motonari et al. |
| 2004/0175948 A1 | 9/2004 | DeSimone et al. |
| 2006/0046490 A1* | 3/2006 | Banerjee et al. ............. 438/692 |

FOREIGN PATENT DOCUMENTS

| EP | 1198534 | 10/2004 |
| JP | 2001-313275 | 11/2001 |

* cited by examiner

*Primary Examiner*—Scott B. Geyer
*Assistant Examiner*—Seahvosh Nikmanesh
(74) *Attorney, Agent, or Firm*—Lina Yang

(57) ABSTRACT

A composition and associated method for chemical mechanical planarization (or other polishing) are described. The composition contains a ketooxime compound and water. The composition may also contain an abrasive and/or a per compound oxidizing agent. The composition affords tunability of removal rates for metal, barrier material, and dielectric layer materials in metal CMP. The composition is particularly useful in conjunction with the associated method for metal CMP applications (e.g., step 2 copper CMP processes).

26 Claims, No Drawings

US 7,316,977 B2

CHEMICAL-MECHANICAL PLANARIZATION COMPOSITION HAVING KETOOXIME COMPOUNDS AND ASSOCIATED METHOD FOR USE

CROSS-REFERENCE TO RELATED APPLICATIONS

This application claims benefit of U.S. Provisional Application No. 60/711,241, filed Aug. 24, 2005. The disclosure of this provisional application is hereby incorporated by reference.

FIELD OF THE INVENTION

This invention relates to an improved composition and process for the chemical mechanical polishing or planarization of semiconductor wafers. More particularly, it relates to such a composition and process tailored to meet more stringent requirements of advanced integrated circuit fabrication.

The invention relates to chemical mechanical polishing of substrates using an abrasive and a fluid composition comprising ketooxime compounds, and particularly relates to a method of polishing substrates comprising copper, at least one barrier material, and at least one dielectric material using a chemical-mechanical polishing system comprising ketooxime compounds, or comprising ketooxime compounds and per-compound oxidizing agents.

BACKGROUND OF THE INVENTION

This invention relates generally to the chemical-mechanical polishing (CMP) of metal substrates on semiconductor wafers and slurry compositions therefor. In particular, the present invention relates to a CMP slurry composition which is characterized to enhance removal of barrier layer materials, copper, and low-k dielectric materials in relation to PETEOS dielectric layer materials, and to provide tunability for the selective removal of barrier layer materials, copper, low-k dielectric materials, and PETEOS dielectric layer materials, during CMP processing of substrates comprised of metal, barrier layer materials, and dielectric layer materials. This invention is especially useful for metal CMP and most especially for step 2 copper CMP processes.

Chemical mechanical planarization (chemical mechanical polishing, CMP) for planarization of semiconductor substrates is now widely known to those skilled in the art and has been described in numerous patents and open literature publications. Some introductory references on CMP are as follows: "Polishing Surfaces for Integrated Circuits", by B. L. Mueller and J. S. Steckenrider, Chemtech, February, 1998, pages 38-46; H. Landis et al., Thin Solids Films, 220 (1992), page 1; and "Chemical-Mechanical Polish" by G. B. Shinn et al., Chapter 15, pages 415-460, in Handbook of Semiconductor Manufacturing Technology, editors: Y. Nishi and R. Doering, Marcel Dekker, New York City (2000).

In a typical CMP process, a substrate (e.g., a wafer) is placed in contact with a rotating polishing pad attached to a platen. A CMP slurry, typically an abrasive and chemically reactive mixture, is supplied to the pad during CMP processing of the substrate. During the CMP process, the pad (fixed to the platen) and substrate are rotated while a wafer carrier system or polishing head applies pressure (downward force) against the substrate. The slurry accomplishes the planarization (polishing) process by chemically and mechanically interacting with the substrate film being planarized due to the effect of the downward force and the rotational movement of the pad relative to the substrate. Polishing is continued in this manner until the desired film on the substrate is removed with the usual objective being to effectively planarize the substrate. Typically metal CMP slurries contain an abrasive material, such as silica or alumina, suspended in an oxidizing, aqueous medium.

Silicon based semiconductor devices, such as integrated circuits (ICs), typically include a dielectric layer. Multilevel circuit traces, typically formed from aluminum or an aluminum alloy or copper, are patterned onto the dielectric layer substrate. These are numerous types of layers that can be polished by CMP, for example, silicon nitride, interlayer dielectrics (ILD) such as silicon oxide and low-k films including carbon-doped oxides; metal layers such as tungsten, copper, aluminum, etc., which are used to connect the active devices; barrier layer materials such as titanium, titanium nitride, tantalum, tantalum nitride, noble metals, etc.

CMP processing is often employed to remove and planarize excess metal at different stages of semiconductor manufacturing. Various metals and metal alloys have been used at different stages of semiconductor manufacturing, including tungsten, aluminum, copper, tantalum, tantalum nitride, titanium, titanium nitride, ruthenium, platinum, iridium, and combinations thereof. For example, one way to fabricate a multilevel copper interconnect or planar copper circuit traces on a dielectric substrate is referred to as the damascene process. In a semiconductor manufacturing process typically used to form a multilevel copper interconnect, metallized copper lines or copper vias are formed by electrochemical metal deposition followed by copper CMP processing. In a typical process, the interlevel dielectric (ILD) surface is patterned by a conventional dry etch process to form vias and trenches for vertical and horizontal interconnects and make connection to the sublayer interconnect structures. The patterned ILD surface typically is coated with an adhesion-promoting layer such as titanium or tantalum and/or a diffusion barrier layer such as titanium nitride or tantalum nitride over the ILD surface and into the etched trenches and vias. The adhesion-promoting layer and/or the diffusion barrier layer is then overcoated with copper, for example, by a seed copper layer and followed by an electrochemically deposited copper layer. Electro-deposition is continued until the structures are filled with the deposited metal. Finally, CMP processing is used to remove the copper overlayer, adhesion-promoting layer, and/or diffusion barrier layer, until a planarized surface with exposed elevated portions of the dielectric (silicon dioxide and/or low-k) surface is obtained. The vias and trenches remain filled with electrically conductive copper forming the circuit interconnects. The adhesion-promoting layer plus diffusion barrier layer is typically collectively referred to as the "barrier layer."

A multi-step copper CMP process may be employed to achieve local and global planarization in the production of IC chips, referred to as a step 1 copper CMP process, followed by a barrier layer CMP process. In relation to copper CMP, the current state of this technology involves use of a two-step process. During step 1 of a copper CMP process, the overburden copper is removed and planarized. Then step 2 of the copper CMP process follows to remove the barrier layer materials and achieve both local and global planarization. The barrier layer CMP process is frequently referred to as a barrier or step 2 copper CMP process. The ratio of the removal rate of copper to the removal rate of dielectric material is called the "selectivity" for removal of copper in relation to dielectric material during CMP processing of substrates comprised of copper, barrier layer materials, and dielectric material. The ratio of the removal rate of barrier layer materials to the removal rate of copper is called the "selectivity" for removal of barrier layer materials in relation to copper during CMP processing of substrates comprised of copper, barrier layer materials, and dielectric materials. Barrier layer materials include tantalum, tantalum nitride, tungsten, noble metals such as ruthenium and ruthenium oxide, and combinations thereof.

When CMP slurries over-polish copper layers they may create a depression or "dishing" effect in the copper vias and trenches. This feature distortion is unacceptable due to lithographic and other constraints in semiconductor manufacturing. Another feature distortion that is unsuitable for semiconductor manufacturing is called "erosion." Erosion is the topography difference between a field of dielectric and a dense array of copper vias or trenches. In CMP, the materials in the dense array may be removed or eroded at a faster rate than the surrounding field of dielectric. This causes a topography difference between the field of dielectric and the dense copper array.

A number of systems for CMP of copper have been disclosed. A few illustrative examples are listed next. Kumar et al. in an article entitled "Chemical-Mechanical Polishing of Copper in Glycerol Based Slurries" (*Materials Research Society Symposium Proceedings,* 1996) disclose a slurry that contains glycerol and abrasive alumina particles. An article by Gutmann et al. entitled "Chemical-Mechanical Polishing of Copper with Oxide and Polymer Interlevel Dielectrics" (*Thin Solid Films,* 1995) discloses slurries based on either ammonium hydroxide or nitric acid that may contain benzotriazole (BTA) as an inhibitor of copper dissolution. Luo et al. in an article entitled "Stabilization of Alumina Slurry for Chemical-Mechanical Polishing of Copper" (*Langmuir,* 1996) discloses alumina-ferric nitrate slurries that contain polymeric surfactants and BTA. Carpio et al. in an article entitled "Initial Study on Copper CMP Slurry Chemistries" (*Thin Solid Films,* 1995) disclose slurries that contain either alumina or silicon particles, nitric acid or ammonium hydroxide, with hydrogen peroxide or potassium permanganate as an oxidizer.

Generally, after removal of overburden copper in step 1, polished wafer surfaces have non-uniform local and global planarity due to differences in the step heights at various locations of the wafer surfaces. Low density features tend to have higher copper step heights whereas high density features tend to have low step heights. Due to differences in the step heights after step 1, selective slurries are highly desirable for step 2 copper CMP for the selective removal of barrier layer materials in relation to copper and for the selective removal of dielectric materials in relation to copper.

A typically used CMP slurry has two actions, a chemical component and a mechanical component. There are a number of theories as to the mechanism for chemical mechanical polishing of copper. An article by Zeidler et al. (*Microelectronic Engineering,* 1997) proposes that the chemical component forms a passivation layer on the copper changing the copper to a copper oxide. The copper oxide has different mechanical properties, such as density and hardness, than metallic copper and passivation changes the polishing rate of the abrasive portion. The above article by Gutmann et al. discloses that the mechanical component abrades elevated portions of copper and the chemical component then dissolves the abraded material. The chemical component also passivates recessed copper areas minimizing dissolution of those portions.

In the case of CMP of metals, the chemical action is generally considered to take one of two forms. In the first mechanism, the chemicals in the solution react with the metal layer to continuously form an oxide layer on the surface of the metal. This generally requires the addition of an oxidizer to the solution such as hydrogen peroxide, ferric nitrate, etc. Then the mechanical abrasive action of the particles continuously and simultaneously removes this oxide layer. A judicious balance of these two processes obtains optimum results in terms of removal rate and polished surface quality.

In the second mechanism, no protective oxide layer is formed. Instead, the constituents in the solution chemically attack and dissolve the metal, while the mechanical action is largely one of mechanically enhancing the dissolution rate by such processes as continuously exposing more surface area to chemical attack, raising the local temperature (which increases the dissolution rate) by the friction between the particles and the metal, and enhancing the diffusion of reactants and products to and away from the surface by mixing and by reducing the thickness of the boundary layer.

BRIEF SUMMARY OF THE INVENTION

In one embodiment, the invention is a chemical-mechanical planarization composition comprising:
a) an abrasive;
b) a ketooxime compound having the structure:

where $R_1$ and $R_2$ are independently unsubstituted $C_1$-$C_4$ alkyl or substituted $C_1$-$C_4$ alkyl with one or more substituents selected from the group consisting of —OH, —OR, —Cl, —F, —Br, where R is $C_1$-$C_4$ alkyl; and
c) water.

The polishing composition is useful in chemical-mechanical polishing (CMP), and especially in metal CMP for the planarization of silicon based semiconductor devices, such as integrated circuits and memory devices.

In another embodiment, the invention is a chemical-mechanical planarization composition comprising:
a) an abrasive;
b) a ketooxime compound having the structure:

where $R_1$ and $R_2$ are independently unsubstituted $C_1$-$C_4$ alkyl or substituted $C_1$-$C_4$ alkyl with one or more substituents selected from the group consisting of —OH, —OR, —Cl, —F, —Br, where R is $C_1$-$C_4$ alkyl;
c) water; and
d) a per-compound oxidizing agent.

In an additional embodiment, the invention is a chemical-mechanical planarization composition comprising:
a) an abrasive;
b) a ketooxime compound having the structure:

where $R_1$ and $R_2$ are independently unsubstituted $C_1$-$C_4$ alkyl or substituted $C_1$-$C_4$ alkyl with one or more substituents selected from the group consisting of —OH, —OR, —Cl, —F, —Br, where R is $C_1$-$C_4$ alkyl;
c) water;
d) a per-compound oxidizing agent;

e) a surfactant; and
f) a corrosion inhibitor.

In an additional embodiment, the invention is a method of step 2 chemical-mechanical planarization, said method comprising the steps of:
A) placing a substrate comprising copper, at least one dielectric material and at least one barrier material in contact with a polishing pad;
B) delivering a chemical-mechanical planarization composition comprising a) an abrasive; b) a ketooxime compound having the structure:

where $R_1$ and $R_2$ are independently unsubstituted $C_1$-$C_4$ alkyl or substituted $C_1$-$C_4$ alkyl with one or more substituents selected from the group consisting of —OH, —OR, —Cl, —F, —Br, where R is $C_1$-$C_4$ alkyl; and c) water; and
C) polishing the substrate with the polishing composition.

In an additional embodiment, the invention is a method of step 2 chemical-mechanical planarization, said method comprising the steps of:
A) placing a substrate comprising copper, at least one dielectric material and at least one barrier material in contact with a polishing pad;
B) delivering a chemical-mechanical planarization composition comprising a) an abrasive; b) a ketooxime compound having the structure:

where $R_1$ and $R_2$ are independently unsubstituted $C_1$-$C_4$ alkyl or substituted $C_1$-$C_4$ alkyl with one or more substituents selected from the group consisting of —OH, —OR, —Cl, —F, —Br, where R is $C_1$-$C_4$ alkyl; c) water; d) a per-compound oxidizing agent; and
C) polishing the substrate with the polishing composition.

In yet another embodiment, the invention is a chemical-mechanical planarization composition comprising:
a) at least one ketooxime compound; and
b) water.

DETAILED DESCRIPTION OF THE INVENTION

It has been found that CMP polishing compositions comprising an abrasive, a ketooxime compound having the structure given supra, a per-compound oxidizing agent, and water possess high removal rates for metal (e.g., copper), barrier layer material (e.g., tantalum nitride), and low-k dielectric layer materials (e.g., Black Diamond®), in relation to PETEOS dielectric materials; and provide tunability for the selective removal of barrier layer materials, copper, low-k dielectric layer materials, and PETEOS dielectric layer materials; during CMP processing. Consequently these polishing compositions are particularly useful in copper CMP processing (e.g., step 2 copper CMP). Optionally, other additives may be included.

Suitable ketooxime compounds for this invention include, but are not limited to, compounds having the structures:

where $R_1$ and $R_2$ are independently unsubstituted $C_1$-$C_4$ alkyl or substituted $C_1$-$C_4$ alkyl with one or more substituents selected from the group consisting of —OH, —OR, —Cl, —F, —Br, where R is $C_1$-$C_4$ alkyl, and combinations thereof. Suitable ketooxime compounds include, but are not limited to, α,β-diketone monoxime compounds of diones and derivatives of diones such as 1,2-propanedione, 1,2,-butanedione, 2,3-butanedione, 1,2-pentanedione, 2,3-pentanedione, 1,2-hexanedione, 2,3-hexanedione, and 3,4-hexanedione. Suitable ketooxime compounds for this invention include, but are not limited to, 2,3-butanedione monoxime. A preferred α,β-diketone monoxime is 2,3-butanedione monoxime (i.e., diacetyl monoxime.) The ketooxime compound having the structure given supra for this invention is present in the slurry in a concentration of about 0.1 weight % to about 5 weight % of the total weight of the slurry. In one embodiment, the ketooxime compound having the structure given supra for this invention is present in a concentration of about 0.5 weight % to about 3 weight % of the total weight of the slurry.

Both standard (unmodified) abrasives and surface-modified abrasives can be employed in this invention when applicable. Suitable unmodified abrasives include, but are not limited to, silica, alumina, titania, zirconia, germania, ceria, and co-formed products thereof, and mixtures thereof. A surface-modified abrasive obtained by treatment of an unmodified abrasive (e.g., silica) with an inorganic or organometallic compound can also be employed in this invention. Suitable inorganic compounds for modification include boric acid, sodium aluminate, and potassium aluminate. Suitable organometallic compounds for modification include aluminum acetate, aluminum formate, and aluminum propionate. Suitable abrasives include, but are not limited to, colloidal products, fumed products, and mixtures thereof. Some specific examples of surface-modified abrasives are modification of silica with boric acid to give boron surface-modified silica and modification of silica with sodium aluminate or potassium aluminate to give aluminate surface-modified silica.

Silica and surface-modified silica are a preferred abrasive material used in the present invention. The silica may be, for example, colloidal silica, fumed silica and other silica dispersions; however, the preferred silica is colloidal silica or surface-modified colloidal silica.

In most embodiments, the abrasive is present in the slurry in a concentration of about 0.001 weight % to about 30 weight % of the total weight of the slurry. In one embodiment, the abrasive is present in a concentration of about 1 weight % to about 20 weight % of the total weight of the slurry. In another embodiment, the abrasive is present in a concentration of about 0.01 weight % to about 5 weight % of the total weight of the slurry. In yet another embodiment, the abrasive is absent and the inventive composition is an abrasiveless slurry.

The per-compound oxidizing agent can be any suitable per-compound oxidizing agent. Suitable per-compound oxidizing agents include, for example, one or more per-compounds, which comprise at least one peroxy group (—O—O—). Suitable per-compounds include, for example, peroxides, persulfates (e.g., monopersulfates and dipersulfates), percarbonates, and acids thereof, and salts thereof, and mixtures thereof. Preferred per-compound oxidizing agents include, for example, hydrogen peroxide, urea-hydrogen peroxide, sodium peroxide, benzyl peroxide, di-t-butyl peroxide, peracetic acid, monopersulfuric acid, dipersulfuric acid, and salts thereof, and mixtures thereof. The per-compound oxidizing agent in the compositions of this invention is present in the slurry in a concentration of about 0.02 weight % to about 10 weight %. In one embodiment, the per-compound oxidizing agent is present in a concentration of about 0.05 weight % to about 5 weight % of the total weight of the slurry.

Hydrogen peroxide is used as a preferred per-compound oxidizing agent. Preferably the concentration of the hydrogen peroxide is from about 0.05 weight % to about 7.5 weight % of the total weight of the slurry.

Other chemicals that may be added to the CMP slurry composition include, for example, additional oxidizing agents, water-miscible solvents, surfactants, pH adjusting agents, acids, corrosion inhibitors, fluorine-containing compounds, chelating agents, non-polymeric nitrogen-containing compounds, and salts.

The additional oxidizing agent can be any suitable oxidizing agent. In preferred embodiments, the polishing composition or slurry comprising abrasive, ketooxime compounds and per-compound oxidizing agent of this invention are substantially free of hydroxylamines, or adducts or salts (i.e., derivatives) thereof, or combinations thereof. As used herein, the term substantially free as it pertains to additional oxidizing agents means less than about 0.1 weight % of the total weight of the slurry, for example less than about 0.01 weight %, and most preferably completely free of the component. Salts of hydroxylamines include hydroxylamine nitrate, hydroxylamine sulfate, hydroxylamine phosphate, and the like. Adducts of hydroxylamine include the compound where each R of the $R_2N$—OR compound is independently hydrogen or a linear, branched, or cyclic hydrocarbon containing from 1 to 7 carbon atoms. Adducts of hydroxylamine can be present in salt form as well, e.g., as nitrates, sulfates, phosphates, or the like, or a combination thereof. Suitable additional oxidizing agents include, for example, oxidized halides (e.g., chlorates, bromates, iodates, perchlorates, perbromates, periodates, and acids thereof, and mixtures thereof, and the like), perboric acid, perborates, percarbonates, peroxyacids (e.g., peracetic acid, perbenzoic acid, m-chloroperbenzoic acid, salts thereof, mixtures thereof, and the like), permanganates, chromates, cerium compounds, ferricyanides (e.g., potassium ferricyanide), mixtures thereof, and the like. Preferred additional oxidizing agents include, for example, iodic acid, and salts thereof, and mixtures thereof. The additional oxidizing agent may be present in the slurry composition in a concentration of about 0 weight % to about 10 weight %. In one embodiment, the additional oxidizing agent is present in a concentration of about 0.05 weight % to about 5 weight % of the total weight of the slurry.

Suitable water-miscible solvents that may be added to the slurry composition include, for example, ethyl acetate, methanol, ethanol, propanol, isopropanol, butanol, glycerol, ethylene glycol, and propylene glycol, and mixtures thereof. The water-miscible solvents may be present in the slurry composition in a concentration of about 0 weight % to about 4 weight % in one embodiment, of about 0.1 weight % to about 2 weight % in another embodiment, and, in a concentration of about 0.5 weight % to about 1 weight % in yet another embodiment; each of these weight % values is based on the total weight of the slurry. The preferred types of water-miscible solvents are isopropanol, butanol, and glycerol.

Suitable surfactant compounds that may be added to the slurry composition include, for example, any of the numerous nonionic, anionic, cationic or amphoteric surfactants known to those skilled in the art. The surfactant compounds may be present in the slurry composition in a concentration of about 0 weight % to about 1 weight % in one embodiment, of about 0.0005 weight % to about 1 weight % in another embodiment, and, in a concentration of about 0.001 weight % to about 0.5 weight % in yet another embodiment; each of these weight % values is based on the total weight of the slurry. The preferred types of surfactants are nonionic, anionic, or mixtures thereof and are most preferably present in a concentration of about 10 ppm to about 1000 ppm of the total weight of the slurry. Nonionic surfactants are most preferred.

The pH-adjusting agent is used to improve the stability of the polishing composition, to improve the safety in use or to meet the requirements of various regulations. As a pH-adjusting agent to be used to lower the pH of the polishing composition of the present invention, hydrochloric acid, nitric acid, sulfuric acid, chloroacetic acid, tartaric acid, succinic acid, citric acid, malic acid, malonic acid, various fatty acids, various polycarboxylic acids may be employed. On the other hand, as a pH-adjusting agent to be used for the purpose of raising the pH, potassium hydroxide, sodium hydroxide, ammonia, tetramethylammonium hydroxide, ethylenediamine, piperazine, polyethyleneimine, etc., may be employed. The polishing composition of the present invention is not particularly limited with respect to the pH, but it is usually adjusted to pH 5 to 11. In one embodiment, a suitable slurry pH is from about 5 to about 11. In another embodiment, a suitable slurry pH is from about 6 to about 10.

Other suitable acid compounds that may be added (in place of or in addition to the pH-adjusting acids mentioned supra) to the slurry composition include, but are not limited to, formic acid, acetic acid, propanoic acid, butanoic acid, pentanoic acid, hexanoic acid, heptanoic acid, octanoic acid, nonanoic acid, lactic acid, hydrochloric acid, nitric acid, phosphoric acid, sulfuric acid, hydrofluoric acid, malic acid, tartaric acid, gluconic acid, citric acid, phthalic acid, pyrocatechoic acid, pyrogallol carboxylic acid, gallic acid, tannic acid, and mixtures thereof. These acid compounds may be present in the slurry composition in a concentration of about 0 weight % to about 5 weight % of the total weight of the slurry.

Suitable corrosion inhibitors that may be added to the slurry composition include, for example, 1,2,4-triazole, benzotriazole, 6-tolylytriazole, tolyltriazole derivatives, 1-(2,3-dicarboxypropyl)benzotriazole, branched-alkylphenol-substituted-benzotriazole compounds, TINUVIN® 99-2, TINUVIN® 109, TINUVIN® 213, TINUVIN® 234, TINUVIN® 326, TINUVIN® 328, TINUVIN® 329, TINUVIN® 384-2, N-acyl-N-hydrocarbonoxyalkyl aspartic acid compounds, and mixtures thereof. The corrosion inhibitor may be present in the slurry in a concentration of about 0 ppm to about 4000 ppm in an embodiment, from about 10 ppm to about 4000 ppm in another embodiment, and from about 50 ppm to about 2000 ppm in yet another embodiment, all based on the total weight of the slurry. Preferred corrosion inhibitors are 1,2,4-triazole, TINUVIN® 109, TINUVIN® 328, TINUVIN® 329, CDX2128 and CDX2165. CDX2128 and CDX2165 are supplied by King Industries, and are preferably present in a concentration of about 0 ppm to about 1000 ppm of the total weight of the slurry. TINUVIN® 109, TINUVIN® 328, and TINUVIN® 329 are supplied by Ciba Specialty Chemicals Corporation, and are preferably present in a concentration of about 0 ppm to about 500 ppm of the total weight of the slurry.

Carboxylic acids, if added, may also impart corrosion inhibition properties to the slurry composition.

To increase further the selectivity of tantalum and tantalum compounds relative to silicon dioxide, fluorine-containing compounds may be added to the slurry composition. Suitable fluorine-containing compounds include, for example, hydrogen fluoride, perfluoric acid, alkali metal fluoride salt, alkaline earth metal fluoride salt, ammonium fluoride, tetramethylammonium fluoride, ammonium bifluoride, ethylenediammonium difluoride, diethylenetriammonium trifluoride, and mixtures thereof. The fluorine-containing compounds may be present in the slurry composition in a concentration of about 0 weight % to about 5 weight % in an embodiment, preferably from about 0.65 weight % to about 5 weight % in another embodiment, from about 0.5 weight % to about 2 weight % in yet another embodiment, all based on the total weight of the slurry. A suitable fluorine-containing compound is ammonium fluoride.

Suitable chelating agents that may be added to the slurry composition include, but are not limited to, ethylenediaminetetracetic acid, N-hydroxyethylethylenediaminetriacetic acid, nitrilotriacetic acid, diethylenetriaminepentacetic acid, ethanoldiglycinate, glycine, tricine, citric acid, 2,3-butanedione dioxime (dimethylglyoxime) and mixtures thereof. The chelating agents may be present in the slurry composition in a concentration of about 0 weight % to about 3 weight % in one embodiment, and in a concentration of about 0.1 weight % to about 2 weight % in another embodiment based on the total weight of the slurry. Preferred chelating agents are glycine, tricine, citric acid, 2,3-butanedione dioxime and ethylenediaminetetracetic acid. When present, a chelating agent is usually present in a concentration of about 0.1 weight % to about 2 weight % of the total weight of the slurry.

Suitable non-polymeric nitrogen-containing compounds (amines, hydroxides, etc.) that may be added to the slurry composition include, for example, ammonium hydroxide, monoethanolamine, diethanolamine, triethanolamine, diethyleneglycolamine, N-hydroxylethylpiperazine, and mixtures thereof. These non-polymeric nitrogen-containing compounds may be present in the slurry composition in a concentration of about 0 weight % to about 1 weight %, and, if present, are normally present at a level of about 0.01 weight % to about 0.2 weight % of the total weight of the slurry. A preferred non-polymeric nitrogen-containing compound is ammonium hydroxide and is most preferably present in a concentration of about 0.01 weight % to about 0.1 weight % of the total weight of the slurry.

Suitable salts that optionally may be added to the slurry composition include, for example, ammonium persulfate, potassium persulfate, potassium sulfite, potassium carbonate, ammonium nitrate, potassium hydrogen phthalate, hydroxylamine sulfate, and mixtures thereof. The salts may be present in the slurry composition in a concentration of about 0 weight % to about 10 weight %, and, if present, are normally present at a level of about 0.02 weight % to about 5 weight % of the total weight of the slurry.

Still other chemicals that can be added to the slurry compositions are biological agents such as bactericides, biocides and fungicides especially if the pH is around about 6 to 9. Suitable biocides, include, but are not limited to, 1,2-benzisothiazolin-3-one; 2(hydroxymethyl)amino ethanol; 1,3-dihydroxymethyl-5,5-dimethylhydantoin; 1-hydroxymethyl-5,5-dimethylhydantion; 3-iodo-2-propynyl-butylcarbamate; glutaraldehyde; 1,2-dibromo-2,4-dicyanobutane; 5-chloro-2-methyl-4-isothiazoline-3-one; 2-methyl-4-isothiazolin-3-one; and mixtures thereof. Preferred biocides are isothiazolines and benzisothiazolines. When present, a biocide is usually present in a concentration of about 0.001 weight % to about 0.1 weight % of the total weight of the slurry.

Associated Methods

The associated methods of this invention entail use of the aforementioned composition (as disclosed supra) for chemical mechanical planarization of substrates comprised of metals, barrier layer materials, and dielectric materials. In the methods, a substrate (e.g., a wafer) is placed face-down on a polishing pad which is fixedly attached to a rotatable platen of a CMP polisher. In this manner, the substrate to be polished and planarized is placed in direct contact with the polishing pad. A wafer carrier system or polishing head is used to hold the substrate in place and to apply a downward pressure against the backside of the substrate during CMP processing while the platen and the substrate are rotated. The polishing composition (slurry) is applied (usually continuously) on the pad during CMP processing to effect the removal of material to planarize the substrate. Since the associated methods of this invention employ the compositions described herein, the ranges (e.g., pH, component levels) described for composition embodiments also apply to corresponding method embodiments.

The composition and associated methods of this invention are effective for CMP of a wide variety of substrates, including substrates having dielectric portions that comprise materials having dielectric constants less than 3.3 (low-k materials). Suitable low-k films in substrates include, but are not limited to, organic polymers, carbon-doped oxides, fluorinated silicon glass (FSG), inorganic porous oxide-like materials, and hybrid organic-inorganic materials. Representative low-k materials and deposition methods for these materials are summarized below.

| Vendor | Trade Name | Deposition Method | Material |
|---|---|---|---|
| Air Products and Chemicals | MesoElk ® | Spin-on | Hybrid organic-inorganic |
| Applied Materials | Black Diamond ® | CVD | Carbon-doped oxide |
| Dow Chemical | SiLK ™, Porous SiLK ™ | Spin-on | Organic polymer |
| Honeywell Electronic Materials | NANOGLASS ® E | Spin-on | Inorganic oxide-like |
| Novellus Systems | CORAL ® | PECVD | Carbon-doped oxide |

PECVD = Plasma enhanced chemical vapor deposition
CVD = chemical vapor deposition Similarly, the composition and associated methods of this invention are effective for CMP of substrates comprised of various metals, including, but not limited to, tantalum, titanium, tungsten, copper, and noble metals. The composition and associated methods of this invention are particularly useful and preferred in copper CMP processing (e.g., step 2 copper CMP), and afford tunability for the selective removal of barrier layer materials, copper, low-k dielectric layer materials, and PETEOS dielectric layer materials; and high removal rates for metal (e.g., copper), barrier layer material (e.g., tantalum nitride), and low-k dielectric layer materials (e.g., Black Diamond®), in relation to PETEOS dielectric materials (as illustrated in the examples). A combination of (i) abrasive concentration, (ii) abrasive type selected between an unmodified versus a surface-modified abrasive, and (iii) the synergistic combination of hydrogen peroxide concentration with the various concentrations of ketooxime compounds, offers considerable flexibility and provides tunability for the selective removal of barrier layer materials, copper, low-k dielectric materials, and PETEOS dielectric layer materials, during CMP processing by varying tantalum nitride:Black Diamond® removal rate selectivity between values of 0.7 to 2.0, tantalum nitride:copper removal rate selectivity between values of 0.7 to 3.5, tantalum nitride: PETEOS removal rate selectivity between values of 1.8 to greater than 16, copper:Black Diamond® removal rate selectivity between values of 0.2 to 2.2, and copper:PETEOS removal rate selectivity between values of 1.9 to greater than 19.

While not being bound by any particular theory, the inventors believes that the following considerations may explain why a polishing composition comprising a) an abrasive, b) a ketooxime compound, c) water, and d) an per-compound oxidizing agent exhibits enhanced tantalum nitride, copper, and low-k dielectric removal rates in CMP processing. Typically when a slurry composition is exposed to copper and tantalum nitride with a commonly used oxidizer such as hydrogen peroxide under basic conditions during CMP processing, both copper and tantalum nitride undergo corrosion to form copper and tantalum ions, which forms passive hard copper oxide and tantalum oxide films. This phenomenon is well understood, and described in Pourbaix diagrams of copper (pages 385-392) and tantalum (pages 251-255) in Atlas of Electrochemical Equilibria in Aqueous Solutions ($2^{nd}$ Edition), by M. J. N. Pourbaix, published by National Association of Corrosion Engineers, Houston, Tex. (1974). Thus copper and tantalum nitride removal rates are very low. As described in this invention, the addition of a ketooxime compound to a slurry results in complexation with copper and tantalum ions under basic pH polishing conditions. This complexation assists in maintaining copper and tantalum ions in solution as ketooxime complexes, resulting in high copper and tantalum nitride removal rates, high selectivity for removal of copper in relation to PETEOS at low abrasive concentration, and high selectivity for removal of tantalum nitride in relation to PETEOS at low abrasive concentration. Unlike hydrogen peroxide, ketooxime compounds serve not only as an oxidant but also complex the copper ions and tantalum ions. These dual roles result in high copper and tantalum nitride removal rates. Interestingly, the inventive slurry also facilitates high removal rates of Black Diamond® low-k dielectric material.

The present invention is further demonstrated by the examples below.

GLOSSARY

Exemplary Components (and Equivalents Thereof)
A) Ketooxime compound: 2,3-Butanedione Monoxime: Aldrich Chemical Company, Inc, 1001 West St. Paul, Milwaukee, Wis. 53233.
B) Other co-additives with ketooxime compounds in the polishing compositions:

A List of Other Additives Used in the Polishing Formulations is Summarized Below:
1) Hydrogen Peroxide: a 30 weight % solution, Air Products and Chemicals, Inc., 7201 Hamilton Blvd., Allentown, Pa. 18195.
2) Potassium Hydroxide: Aldrich Chemical Company, Inc, 1001 West St. Paul, Milwaukee, Wis. 53233.
3) Nitric Acid: a 70 weight % solution, Columbus Chemical Industries, Inc., P.O. Box 8, Columbus, Wis. 53925.
4) Potassium-stabilized Colloidal Silica: DuPont Air Products NanoMaterials L.L.C., 2507 West Erie Drive, Tempe, Ariz. 85282 (an approximately 30 weight % potassium-stabilized dispersion in water with a particle size of 50-60 nanometers as measured by Capillary Hydro-Dynamic Flow using a Matec Applied Sciences model number CHDF 2000 instrument.)
5) Potassium Aluminate Surface-modified Colloidal Silica: DuPont Air Products NanoMaterials L.L.C., 2507 West Erie Drive, Tempe, Ariz. 85282 (an approximately 30 weight % potassium-stabilized dispersion in water with a particle size of 50-60 nanometers as measured by Capillary Hydro-Dynamic Flow using a Matec Applied Sciences model number CHDF 2000 instrument.)
6) 2,3-Butanedione: Aldrich Chemical Company, Inc, 1001 West St. Paul, Milwaukee, Wis. 53233.
7) 2,3-Butanedione Dioxime: Aldrich Chemical Company, Inc, 1001 West St. Paul, Milwaukee, Wis. 53233.
8) Acetone Oxime: Aldrich Chemical Company, Inc, 1001 West St. Paul, Milwaukee, Wis. 53233.
C) General

| | |
|---|---|
| Black Diamond ® | Applied Producer ® Black Diamond ® chemical vapor deposition (CVD) film, a low-k dielectric layer. |
| PETEOS | Plasma enhanced deposition of tetraethoxy silane; a dielectric oxide layer. |
| Blanket Wafers: | Blanket wafers are those that have typically one type of surface prepared for polishing experiments. |

Parameters
Å: angstrom(s)—a unit of length
CMP: chemical mechanical planarization, or chemical mechanical polishing
min: minute(s)
ml: milliliter(s)
psi: pounds per square inch
rpm: revolution(s) per minute

| | |
|---|---|
| TaN:BD1 Sel | Tantalum nitride:Black Diamond ® Selectivity - the ratio of the amount of tantalum nitride removed to the amount of Black Diamond ® removed during CMP experiments using blanket wafers under identical conditions. |
| TaN:Cu Sel | Tantalum nitride:Copper Selectivity - the ratio of the amount of tantalum nitride removed to the amount of copper removed during CMP experiments using blanket wafers under identical conditions. |

-continued

| | |
|---|---|
| TaN:PETEOS Sel | Tantalum nitride:PETEOS Selectivity - the ratio of the amount of tantalum nitride removed to the amount of PETEOS removed during CMP experiments using blanket wafers under identical conditions. |
| Cu:BD1 Sel | Copper:Black Diamond ® Selectivity - the ratio of the amount of copper removed to the amount of Black Diamond ® removed during CMP experiments using blanket wafers under identical conditions. |
| Cu:PETEOS Sel | Copper:PETEOS Selectivity - The ratio of the amount of copper removed to the amount of PETEOS (dielectric material) removed during CMP experiments using blanket wafers under identical conditions. |

EXAMPLES

General

All percentages are weight percentages and all temperatures are degrees Celsius unless otherwise indicated.

Chemical Mechanical Planarization (CMP) Methodology

In the examples presented below, CMP experiments were run using the procedures and experimental conditions given below.

Metrology

PETEOS and Black Diamond® thickness was measured with a Nanometrics, model, #9200, manufactured by Nanometrics Inc, 1550 Buckeye, Milpitas, Calif. 95035. The metal films were measured with a ResMap CDE, model 168, manufactured by Creative Design Engineering, Inc, 20565 Alves Dr, Cupertino, Calif., 95014. This tool is a four-point probe sheet resistance tool. Twenty-five and forty nine-point polar scans were taken with the respective tools at 3-mm edge exclusion.

CMP Tool

The CMP tool that was used is a Mirra®, manufactured by Applied Materials, 3050 Boweres Avenue, Santa Clara, Calif., 95054. A Politex® embossed pad, supplied by Rohm and Haas Electronic Materials, 3804 East Watkins Street, Phoenix, Ariz., 85034, was used on the platen for the blanket wafer polishing studies.

In blanket wafers studies, polish time was 60 seconds per wafer. The Mirra® tool mid-point conditions for polishing blanket wafers were: platen (or table) speed 90 rpm; head speed 84 rpm; retaining ring pressure 3.0 psi; inter-tube pressure 3.0 psi; membrane pressure 2.0 psi; slurry flow 200 ml/min.

Blanket Wafers

Blanket wafer polishing experiments were conducted using Black Diamond®, PETEOS, CVD tantalum nitride, and electrochemically deposited copper wafers. The Black Diamond® wafers were purchased from Advanced Technology Development Facility (ATDF), 2706 Montopolis Drive, Austin, Tex. 78741. The Cu, PETEOS, and tantalum nitride blanket wafers were purchased from Silicon Valley Microelectronics, 1150 Campbell Ave, Calif. 95126. The blanket wafer film thickness specifications are summarized below:

Black Diamond®: 10,000 Å on silicon

Copper: 10,000 Å electroplated copper/1,000 Å copper seed/250 Å tantalum on silicon PETEOS: 15,000 Å on silicon Tantalum nitride: 3000 Å on 3,000 Å thermal oxide (on silicon)

Examples 1-18

Example 1

Preparation of Potassium Aluminate Surface-Modified Colloidal Silica

Potassium aluminate surface-modified colloidal silica having an average particle diameter of 50 to 60 nanometers, as measured by Capillary Hydro-Dynamic Flow using a Matec Applied Sciences model number CHDF 2000 instrument, was prepared using the following procedure.

Approximately 1 kg of Amberlite® IR-120 ion exchange resin (Rohm and Haas Company, Philadelphia, Pa.) was washed with 1 liter of 20% sulfuric acid solution. The mixture was stirred and the resin was allowed to settle. The aqueous layer was decanted and washed with 10 liters of deionized water. The mixture was again allowed to settle and then the aqueous layer was decanted. This procedure was repeated until the decanted water was colorless. This procedure afforded acid-state resin.

Potassium-stabilized colloidal silica (3400 kg, DuPont Air Products NanoMaterials L.L.C., Tempe, Ariz. 85282, an approximately 30 weight % potassium-stabilized dispersion in water with a particle size of 50-60 nanometers as measured by Capillary Hydro-Dynamic Flow using a Matec Applied Sciences model number CHDF 2000 instrument) was placed in a 5 gallon mix tank equipped with an agitator. The pH of the solution was measured to be approximately 10.2. With continued pH monitoring, small amounts of acid-state resin were added, while allowing the pH to stabilize in between additions. Additional acid-state resin was added in small portions until the pH had dropped to pH of 2.5. Once this pH limit had been reached and was stable in this range, no further acid-state resin additions were made and the mixture was stirred for 1-1.5 hours. Subsequently the mixture was passed through a 500-mesh screen to remove the resin and afforded deionized silica.

Potassium aluminate, 18.02 g of 50 weight % solution (United States Aluminate Company, Inc., 9411 Philadelphia Road, Suite H, Baltimore, Md. 21237) was added to 903 g of deionized water in a 3-gallon mixing tank equipped with an agitator. Under agitation, 12.03 g of potassium hydroxide was added to potassium aluminate solution during a period of 3 minutes. The potassium aluminate solution was heated to 60° C., and maintained between 55° C. to 60° C. Deionized silica (3069 g) was then added to the potassium aluminate solution at 58 ml/min while maintaining the temperature between 55° C. to 60° C. After this addition was completed, the mixture was heated for additional 4 hours. The resulting dispersion was subsequently filtered through a 1-micron filter to afford potassium aluminate surface-modified silica.

Example 2 (Comparative)

Procedure for Mixing the Polishing Slurry, 1.5 kg Batch Size

A polishing slurry was prepared comprising 5 weight % hydrogen peroxide with no ketooxime compound; as described below and in Table 1. In a 3 liter beaker, 1099.6 g of deionized water were transferred, and maintained under agitation using a magnetic stirrer. Under agitation, 150 g of potassium-stabilized silica (30 weight % sol) was added over a period of 2 minutes. After completing the addition of silica, 0.35 g of potassium hydroxide (45 weight % solution) was added under agitation. To the formulated slurry, 250 g of hydrogen peroxide (30 weight % solution) was added prior to polishing blanket copper, tantalum nitride, Black Diamond®, and PETEOS wafers using a Mirra® CMP tool. The polishing slurry pH after addition of hydrogen peroxide was 8.5.

Polishing Slurry Mixing Procedure for Examples 3-18:

For Examples 3-18, a procedure similar to Example 2 was used with minor variations; the polishing slurry compositions of Examples 3-18 are tabulated in Tables 1, 2, and 3. In each case, the balance of the composition was deionized water. Final pH adjustment was done using potassium hydroxide or nitric acid as indicated in Tables 1, 2, and 3.

Polishing Experiments for Examples 2-18:

In Examples 2-18, CMP slurry compositions as shown in Tables 1, 2, and 3 were prepared and tested using the methodology, equipment, and processing as described supra. The CMP slurry compositions for Examples 4-5, 10, and 12-18 were comprised of 2,3-butanedione monoxime, colloidal silica, hydrogen peroxide, and potassium hydroxide in an aqueous medium at pH values ranging from 8.5 to 10.3. The CMP slurry composition for Example 3 was comprised of 2,3-butanedione monoxime, colloidal silica, and potassium hydroxide in an aqueous medium at a pH value of 11.0. The CMP slurry composition for Comparative Example 7 was comprised of 2,3-butanedione dioxime, colloidal silica, hydrogen peroxide, and nitric acid in an aqueous medium at a pH value of 10.6. The CMP slurry composition for Comparative Example 6 was comprised of acetone oxime, colloidal silica, hydrogen peroxide, and potassium hydroxide in an aqueous medium at a pH value of 10.4. The CMP slurry composition for Comparative Example 8 was comprised of 2,3-butanedione, colloidal silica, hydrogen peroxide, and potassium hydroxide in an aqueous medium at a pH value of 9.5. The CMP slurry compositions for Comparative Examples 2, 9, and 11 were comprised of colloidal silica, hydrogen peroxide, and potassium hydroxide in an aqueous medium at pH values ranging from 8.5 to 11.2. The weight % levels of 2,3-butanedione monoxime, weight % level of 2,3-butanedione dioxime, weight % level of acetone oxime, weight % level of 2,3-butanedione, weight % levels of abrasive, and weight % levels of hydrogen peroxide were varied as indicated below (and in Tables 1-3):

Example 2—Table 1, Comparative example, 2,3-butanedione monoxime at 0 weight %; hydrogen peroxide at 5 weight %; potassium-stabilized colloidal silica abrasive at 3 weight %

Example 3—Table 1, 2,3-butanedione monoxime at 2 weight %; hydrogen peroxide at 0 weight %; potassium-stabilized colloidal silica abrasive at 3 weight %

Example 4—Table 1, 2,3-butanedione monoxime at 2 weight %; hydrogen peroxide at 5 weight %; potassium-stabilized colloidal silica abrasive at 3 weight %

Example 5—Table 1, 2,3-butanedione monoxime at 2 weight %; hydrogen peroxide at 1 weight %; potassium-stabilized colloidal silica abrasive at 3 weight %

Example 6—Table 1, Comparative example, acetone oxime at 2 weight % (used in place of 2,3-butanedione monoxime); hydrogen peroxide at 1 weight %; potassium-stabilized colloidal silica abrasive at 3 weight %

Example 7—Table 1, Comparative example, 2,3-butanedione dioxime (dimethylglyoxime) at 2 weight % (used in place of 2,3-butanedione monoxime); hydrogen peroxide at 1 weight %; potassium-stabilized colloidal silica abrasive at 3 weight %

Example 8—Table 1, Comparative example, 2,3-butanedione at 2 weight % (used in place of 2,3-butanedione monoxime); hydrogen peroxide at 1 weight %; potassium-stabilized colloidal silica abrasive at 3 weight %

Example 9—Table 1, Comparative example, 2,3-butanedione monoxime at 0 weight %; hydrogen peroxide at 7.5 weight %; potassium-stabilized colloidal silica abrasive at 3 weight %

Example 10—Table 1, 2,3-butanedione monoxime at 2 weight %; hydrogen peroxide at 7.5 weight %; potassium-stabilized colloidal silica abrasive at 3 weight %

Example 11—Table 1, Comparative example, 2,3-butanedione monoxime at 0 weight %; hydrogen peroxide at 1 weight %; potassium-stabilized colloidal silica abrasive at 3 weight %

Example 12—Table 2, 2,3-butanedione monoxime at 1 weight %; hydrogen peroxide at 1 weight %; potassium-stabilized colloidal silica abrasive at 3 weight %

Example 13—Table 2, 2,3-butanedione monoxime at 2 weight %; hydrogen peroxide at 1 weight %; potassium-stabilized colloidal silica abrasive at 3 weight %

Example 14—Table 2, 2,3-butanedione monoxime at 3 weight %; hydrogen peroxide at 1 weight %; potassium-stabilized colloidal silica abrasive at 3 weight %

Example 15—Table 3, 2,3-butanedione monoxime at 2 weight %; hydrogen peroxide at 1 weight %; potassium-stabilized colloidal silica abrasive at 3 weight %

Example 16—Table 3, 2,3-butanedione monoxime at 2 weight %; hydrogen peroxide at 1 weight %; potassium-stabilized colloidal silica abrasive at 6 weight %

Example 17—Table 3, 2,3-butanedione monoxime at 2 weight %; hydrogen peroxide at 1 weight %; potassium aluminate surface-modified colloidal silica abrasive at 3 weight %

Example 18—Table 3, 2,3-butanedione monoxime at 2 weight %; hydrogen peroxide at 1 weight %; potassium aluminate surface-modified colloidal silica abrasive at 6 weight %

The Example 2-18 compositions were used to polish copper, PETEOS, Black Diamond® and tantalum nitride blanket wafers. The results of the polishing experiments such as copper removal rate at 2.0 psi membrane pressure, PETEOS removal rate at 2.0 psi membrane pressure, Black Diamond® removal rate at 2.0 psi membrane pressure, tantalum nitride removal rate at 2.0 psi membrane pressure, TaN:BD1 Sel at 2.0 psi membrane pressure, TaN:Cu Sel at 2.0 psi membrane pressure, TaN:PETEOS Sel at 2.0 psi membrane pressure, Cu:BD1 Sel at 2.0 psi membrane pressure, and Cu:PETEOS Sel at 2.0 psi membrane pressure are summarized in Tables 1, 2 and 3. As illustrated in Tables 1-3, the results clearly demonstrate advantages of using ketooxime compounds in slurry compositions from the standpoint of high copper, tantalum nitride, and Black Diamond® removal rates. Also the results demonstrate a synergy between hydrogen peroxide and ketooxime compounds when used together in slurry formulations.

Example 2 is a comparative example with 5 weight % hydrogen peroxide and without a ketooxime compound, whereas Example 3 contains 2,3-butanedione monoxime but without hydrogen peroxide. When compared to Example 2, Example 3 clearly shows a dramatic increase in copper, tantalum nitride and Black Diamond® removal rates. For example, in Example 2 with 5 weight % hydrogen peroxide the copper removal rate was 41 Å/min and tantalum nitride removal rate was 128 Å/min. In comparison, for Example 3 (with no hydrogen peroxide and 2 weight % 2,3-butanedione monoxime) the copper removal rate increased to 577 Å/min (a 14-fold increase in removal rate compared to Example 2) and the tantalum nitride removal rate increased to 395 Å/min (a 3-fold increase compared to Example 2). Example 4 contains both 5 weight % hydrogen peroxide and 2 weight % 2,3-butanedione monoxime; and interestingly the copper rate increased further to 811 Å/min (a 20-fold increase versus Example 2) and the tantalum nitride rate increased further to 737 Å/min (an 8-fold increase versus Example 2). Clearly these results suggest a synergy between hydrogen peroxide and 2,3-butanedione monoxime. Example 5 shows the effect of decreasing the concentration of hydrogen peroxide to 1 weight % (from 5 weight % in Example 4) on the copper and tantalum nitride removal rates, the copper rate increased (versus Example 4) to 928 Å/min and tantalum nitride rate decreased slightly (versus Example 4) to 693 Å/min, again pointing to a synergy between hydrogen peroxide and 2,3-butanedione monoxime in the slurry formulations.

Examples 5, 6, and 7 show comparisons of 2,3-butanedione monoxime (Example 5) with acetone oxime (Comparative Example 6) and with 2,3-butanedione dioxime (dimethylglyoxime, Comparative Example 7). As shown in Table 1, acetone oxime (Comparative Example 6) has a rather low copper removal rate (116 Å/min) and low tantalum nitride removal rate (179 Å/min); this is believed to be due to the non-chelating and weak complexing nature of acetone oxime. Interestingly, 2,3-butanedione dioxime (Comparative Example 7) has a higher copper removal rate compared to acetone oxime (Comparative Example 6) but lower than 2,3-butanedione monoxime (Example 5). Similarly, 2,3-butanedione dioxime (Comparative Example 7) has a higher tantalum nitride removal rate compared to acetone oxime (Comparative Example 6) but lower than 2,3-butanedione monoxime (Example 5). Unlike acetone oxime, 2,3-butanedione dioxime (Comparative Example 7) has chelating properties, which results in higher copper removal rate (576 Å/min) and higher tantalum nitride removal rate (395 Å/min). A comparison of 2,3-butanedione monoxime (Example 5) with 2,3-butanedione dioxime (Comparative Example 7) shows the copper and tantalum nitride removal rates are much higher for Example 5; this is due to better chelating properties of 2,3-butanedione monoxime when compared to 2,3-butanedione dioxime.

Comparative Example 8, for comparison with Example 5, shows the relative efficacies of 2,3-butanedione and 2,3 butanedione monoxime according to this invention. As shown in Comparative Example 8 (Table 1) where 2,3-butanedione was used in place of 2,3 butanedione monoxime, clearly the use of 2,3-butanedione decreased tantalum nitride removal rate from 693 Å/min for a slurry comprising 2,3-butanedione monoxime (Example 5) to 487 Å/min for a slurry comprising 2,3-butanedione (Comparative Example 8). Interestingly, the use of 2,3-butanedione decreased copper removal rate from 928 Å/min for a slurry comprising 2,3-butanedione monoxime (Example 5) to 321 Å/min for a slurry comprising 2,3-butanedione (Comparative Example 8), an almost 3-fold ratio suggesting strong chelating properties of 2,3-butanedione monoxime when compared to 2,3-butanedione.

Comparative Examples 11, 2, and 9 in Table 1 show the effect of hydrogen peroxide concentration (without a ketooxime compound) on the removal rates of tantalum nitride, Black Diamond®, PETEOS, and copper. Comparative Examples 11, 2, and 9 show only some lesser variations in the removal rates of copper, PETEOS and tantalum nitride as hydrogen peroxide is varied between 1 weight % (Comparative Example 11), 5 weight % (Comparative Example 2) and 7.5 weight % (Comparative Example 9), all in the absence of a ketooxime compound. Examples 5, 4, and 10 in Table 1 show the effect of hydrogen peroxide concentration (with 2,3-butanedione monoxime present at 2 weight %) on the removal rates of tantalum nitride, Black Diamond®, PETEOS, and copper. Examples 5, 4, and 10 show some lesser variations in the removal rates of copper, PETEOS and tantalum nitride as hydrogen peroxide is varied between 1 weight % (Examples 5), 5 weight % (Example 4) and 7.5 weight % (Example 10), all in the presence of a ketooxime compound (2,3-butanedione monoxime). For example, Example 9 without 2,3-butanedione monoxime and with 7.5 weight % hydrogen peroxide had a low tantalum nitride removal rate (179 Å/min), low copper removal rate (98 Å/min) and low Black Diamond® removal rate (231 Å/min). However, Example 10 in comparison containing 2 weight % 2,3-butanedione monoxime and 7.5 weight % hydrogen peroxide, increased tantalum nitride removal rate dramatically to 900 Å/min (a 5-fold increase versus Example 9), increased Black Diamond® removal rate to 597 Å/min (an approximately 3-fold increase versus Example 9), and increased copper removal rate to 900 Å/min (a 10-fold increase versus Example 9), again pointing to a synergy between hydrogen peroxide and 2,3-butanedione monoxime in the slurry formulations.

In Table 2, Examples 12-14 show the effect of increasing the concentration of 2,3-butanedione monoxime on tantalum nitride, copper, and Black Diamond® removal rates. Clearly, copper, tantalum nitride and Black Diamond® removal rates increased as the concentration of 2,3-butanedione monoxime increased from 1 weight % (Example 12) to 2 weight % (Example 13), and were found to decrease as the concentration of 2,3-butanedione monoxime increased from 2 weight % (Example 13) to 3 weight % concentration (Example 14) with the exception of tantalum nitride removal rate, which had a maximum at 3 weight % 2,3-butanedione monoxime (Example 14).

In Table 3, Examples 15 and 16 show the effect of an increase in abrasive concentration on the slurry performance. As the concentration of potassium-stabilized colloidal silica abrasive increased from 3 weight % (Example 15) to 6 weight % (Example 16), the copper, tantalum nitride, PETEOS, and Black Diamond® removal rates all increased, with both the PETEOS and Black Diamond® removal rates approximately doubled. In Table 3, Examples 17 and 18 show the effect of potassium aluminate surface-modified silica and the effect of an increase in abrasive concentration on the slurry performance, for comparison with unmodified potassium-stabilized silica (Examples 15 and 16). Interestingly, potassium aluminate surface-modified silica provided lower copper, Black Diamond® and PETEOS removal rates while maintaining the high tantalum nitride removal at 3 wt % abrasive (comparing Example 15 with Example 17). Similarly, potassium aluminate surface-modified silica provided lower copper, Black Diamond®, PETEOS and tantalum nitride removal rates at 6 wt % abrasive (comparing Example 16 with Example 18).

Thus a combination of (i) abrasive concentration, (ii) the selection of an unmodified versus a surface-modified abrasive, and (iii) the synergistic combination of hydrogen peroxide concentration with the various concentrations of 2,3-butanedione monoxime, offers considerable flexibility and provides tunability for the selective removal of barrier layer materials, copper, low-k dielectric materials, and PETEOS dielectric layer materials, during CMP processing of substrates comprised of metal, barrier layer materials, and dielectric layer materials, by varying the tantalum nitride removal rate, Black Diamond® removal rate, copper removal rate, PETEOS removal rate, tantalum nitride:Black Diamond® removal rate selectivity, tantalum nitride:copper removal rate selectivity, tantalum nitride:PETEOS removal rate selectivity, copper:Black Diamonds® removal rate selectivity, and copper:PETEOS removal rate selectivity.

TABLE 1

Effect of Ketooxime Compounds on Cu, PETEOS, Tantalum Nitride, and Black Diamond ® Blanket Wafer Removal Rates and Removal Rate Selectivities, Using Mixtures of Ketooxime Compounds with Hydrogen Peroxide and Colloidal Silica

|  | Example 2: Comparative | Example 3 | Example 4 | Example 5 | Example 6: Comparative | Example 7: Comparative |
|---|---|---|---|---|---|---|
| Potassium-stabilized silica (weight %) | 3 | 3 | 3 | 3 | 3 | 3 |
| Potassium hydroxide (weight %) | 0.02 | 1.2 | 1.1 | 1.1 | 0.11 | 0 |
| Nitric Acid (weight %) | 0 | 0 | 0 | 0 | 0 | 0.38 |
| 2,3-Butanedione monoxime (weight %) | 0 | 2 | 2 | 2 | 0 | 0 |
| Acetone oxime (weight %) | 0 | 0 | 0 | 0 | 2 | 0 |
| 2,3-Butanedione dioxime (weight %) | 0 | 0 | 0 | 0 | 0 | 2 |
| 2,3-Butanedione (weight %) | 0 | 0 | 0 | 0 | 0 | 0 |
| Hydrogen peroxide (weight %) | 5 | 0 | 5 | 1 | 1 | 1 |
| Deionized Water | Balance | Balance | Balance | Balance | Balance | Balance |
| pH | 8.5 | 11.0 | 9.7 | 10.1 | 10.4 | 10.6 |
| Copper removal rate at 2.0 psi (Å/min) | 41 | 577 | 811 | 928 | 116 | 576 |
| PETEOS removal rate at 2.0 psi (Å/min) | 22 | 53 | 64 | 48 | 74 | 239 |
| Tantalum nitride removal rate at 2.0 psi (Å/min) | 128 | 395 | 737 | 693 | 179 | 395 |
| Black Diamond ® removal rate at 2.0 psi (Å/min) | 92 | 433 | 425 | 417 | Not measured | 456 |
| TaN:BD1 Sel at 2.0 psi | 1.4 | 0.9 | 1.7 | 1.7 | Not measured | 0.9 |
| TaN:Cu Sel at 2.0 psi | 3.1 | 0.7 | 0.9 | 0.7 | 1.5 | 0.7 |
| TaN:PETEOS Sel at 2.0 psi | 5.8 | 7.5 | 12 | 14 | 2.4 | 1.7 |
| Cu:BD1 Sel at 2.0 psi | 0.4 | 1.3 | 1.9 | 2.2 | Not measured | 1.3 |
| Cu:PETEOS Sel at 2.0 psi | 1.9 | 11 | 13 | 19 | 1.6 | 2.4 |

|  | Example 8: Comparative | Example 9: Comparative | Example 10 | Example 11: Comparative |
|---|---|---|---|---|
| Potassium-stabilized silica (weight %) | 3 | 3 | 3 | 3 |
| Potassium hydroxide (weight %) | 0.03 | 0.03 | 1.1 | 0.02 |
| Nitric Acid (weight %) | 0 | 0 | 0 | 0 |
| 2,3-Butanedione monoxime (weight %) | 0 | 0 | 2 | 0 |
| Acetone oxime (weight %) | 0 | 0 | 0 | 0 |
| 2,3-Butanedione dioxime (weight %) | 0 | 0 | 0 | 0 |
| 2,3-Butanedione (weight %) | 2 | 0 | 0 | 0 |
| Hydrogen peroxide (weight %) | 1 | 7.5 | 7.5 | 1 |
| Deionized Water | Balance | Balance | Balance | Balance |
| pH | 9.5 | 9.6 | 8.5 | 11.2 |
| Copper removal rate at 2.0 psi (Å/min) | 321 | 98 | 900 | 64 |
| PETEOS removal rate at 2.0 psi (Å/min) | 134 | 11 | 175 | 0* |
| Tantalum nitride removal rate at 2.0 psi (Å/min) | 487 | 179 | 900 | 222 |
| Black Diamond ® removal rate at 2.0 psi (Å/min) | 360 | 231 | 597 | 316 |
| TaN:BD1 Sel at 2.0 psi | 1.4 | 0.8 | 1.5 | 0.7 |
| TaN:Cu Sel at 2.0 psi | 1.5 | 1.8 | 1.0 | 3.5 |
| TaN:PETEOS Sel at 2.0 psi | 3.6 | 16 | 5.1 | * |
| Cu:BD1 Sel at 2.0 psi | 0.9 | 0.4 | 1.5 | 0.2 |
| Cu:PETEOS Sel at 2.0 psi | 2.4 | 8.9 | 5.1 | * |

*The PETEOS removal rate is zero within experimental error.

TABLE 2

Effect of 2,3-Butanedione Monoxime Concentration on Cu, PETEOS, Tantalum Nitride, and Black Diamond ® Blanket Wafer Removal Rates and Removal Rate Selectivities, Using Mixtures of 2,3-Butanedione Monoxime with Hydrogen Peroxide and Colloidal Silica

|  | Example 12 | Example 13 | Example 14 |
|---|---|---|---|
| Potassium-stabilized silica (weight %) | 3 | 3 | 3 |
| Potassium hydroxide (weight %) | 0.58 | 1.1 | 1.7 |
| 2,3-Butanedione monoxime (weight %) | 1 | 2 | 3 |
| Hydrogen peroxide (weight %) | 1 | 1 | 1 |
| Deionized Water | Balance | Balance | Balance |
| pH | 9.7 | 10.1 | 9.8 |
| Copper removal rate at 2.0 psi (Å/min) | 717 | 1084 | 931 |
| PETEOS removal rate at 2.0 psi (Å/min) | 185 | 241 | 218 |
| Tantalum nitride removal rate at 2.0 psi (Å/min) | 594 | 858 | 875 |
| Black Diamond ® removal rate at 2.0 psi (Å/min) | 614 | 778 | 618 |
| TaN:BD1 Sel at 2.0 psi | 1.0 | 1.1 | 1.4 |
| TaN:Cu Sel at 2.0 psi | 0.8 | 0.8 | 0.9 |
| TaN:PETEOS Sel at 2.0 psi | 3.2 | 3.6 | 4.0 |
| Cu:BD1 Sel at 2.0 psi | 1.2 | 1.4 | 1.5 |
| Cu:PETEOS Sel at 2.0 psi | 3.9 | 4.5 | 4.3 |

TABLE 3

Effect of Abrasive Concentration on Cu, PETEOS, Tantalum Nitride, and Black Diamond ® Blanket Wafer Removal Rates in the Presence of 2,3-Butanedione Monoxime and Hydrogen Peroxide

|  | Example 15 Potassium-stabilized silica | Example 16: Potassium-stabilized silica | Example 17: Potassium aluminate surface-modified silica | Example 18: Potassium aluminate surface-modified silica |
|---|---|---|---|---|
| Silica (weight %) | 3 | 6 | 3 | 6 |
| Potassium hydroxide (weight %) | 1.0 | 1.1 | 1.4 | 1.7 |
| 2,3-Butanedione monoxime (weight %) | 2 | 2 | 2 | 2 |
| Hydrogen peroxide (weight %) | 1 | 1 | 1 | 1 |
| Deionized Water | Balance | Balance | Balance | Balance |
| pH | 10.2 | 10.1 | 10.1 | 10.3 |
| Copper removal rate at 2.0 psi (Å/min) | 928 | 1144 | 529 | 778 |
| PETEOS removal rate at 2.0 psi (Å/min) | 232 | 490 | 86 | 177 |
| Tantalum nitride removal rate at 2.0 psi (Å/min) | 693 | 898 | 637 | 721 |
| Black Diamond ® removal rate at 2.0 psi (Å/min) | 468 | 1049 | 315 | 442 |
| TaN:BD1 Sel at 2.0 psi | 1.5 | 0.9 | 2.0 | 1.6 |
| TaN:Cu Sel at 2.0 psi | 0.7 | 0.8 | 1.2 | 0.9 |
| TaN:PETEOS Sel at 2.0 psi | 3.0 | 1.8 | 7.4 | 4.1 |
| Cu:BD1 Sel at 2.0 psi | 2.0 | 1.1 | 1.7 | 1.8 |
| Cu:PETEOS Sel at 2.0 psi | 4.0 | 2.3 | 6.2 | 4.4 |

The present invention has been set forth with regard to several preferred embodiments, however the present invention's full scope should not be limited to the disclosure of those embodiments, but rather the full scope of the present invention should be ascertained from the claims which follow.

The invention claimed is:

1. A chemical-mechanical planarization composition comprising: a) at least one ketoxime compound; b) water; and c) an abrasive.

2. A method of step 2 copper chemical-mechanical planarization of a substrate comprising copper, at least one dielectric material and at least one barrier material, said method comprising the steps of:

A) contacting the substrate with a polishing pad and with a chemical-mechanical planarization composition of claim 1; and B) polishing the substrate.

3. A step 2 copper chemical-mechanical planarization composition comprising:

a) an abrasive;

b) a ketoxime compound having the structure:
$R_1$—(C=N—OH)—(C=O)—$R_2$ where $R_1$ and $R_2$ are independently unsubstituted $C_1$-$C_4$ alkyl or substituted $C_1$-$C_4$ alkyl with one or more substituents selected from the group consisting of —OH, —OR, —Cl, —F, —Br, where R is $C_1$-$C_4$ alkyl; and c) water.

4. The composition of claim 3 wherein the abrasive is a colloidal abrasive.

5. The composition of claim 3 wherein the abrasive is silica or surface-modified silica.

6. The composition of claim 3 wherein the compound b) is present at a weight percent level in the composition ranging from 0.1 weight % to 5 weight %.

7. The composition of claim 3 further comprising d) a per-compound oxidizing agent.

8. The composition of claim 7 wherein the per-compound oxidizing agent is hydrogen peroxide.

9. The composition of claim 8 wherein hydrogen peroxide is present at a level ranging from 0.05 weight % to 7.5 weight % of the total weight of the composition.

10. The composition of claim 3 wherein the composition has a pH ranging from 5 to 11.

11. The composition of claim 3 further comprising d) a surfactant.

12. The composition of claim 11 wherein the surfactant is a nonionic surfactant.

13. The composition of claim 3 further comprising d) a corrosion inhibitor.

14. The composition of claim 3 wherein the ketoxime compound is 2,3-butanedione monoxime.

15. A method of step 2 copper chemical-mechanical planarization, said method comprising the steps of:
  A) placing a substrate comprising copper, at least one dielectric material and at least one barrier material in contact with a polishing pad;
  B) delivering a chemical-mechanical planarization composition comprising
    a) an abrasive;
    b) a ketoxime compound having the structure:
      $R_1$—(C=N—OH)—(C=O)—$R_2$ where $R_1$ and $R_2$ are independently unsubstituted $C_1$-$C_4$ alkyl or substituted $C_1$-$C_4$ alkyl with one or more substituents selected from the group consisting of —OH, —OR, —Cl, —F, —Br, where R is $C_1$-$C_4$ alkyl; and
    c) water; and
  C) polishing the substrate with the step 2 copper chemical-mechanical planarization composition.

16. The method of claim 15 wherein the abrasive is a colloidal abrasive.

17. The method of claim 15 wherein the abrasive is silica or surface-modified silica.

18. The method of claim 15 wherein the compound b) is present at a weight percent level in the composition ranging from 0.1 weight % to 5 weight %.

19. The method of claim 15 wherein the composition further comprises d) a per-compound oxidizing agent.

20. The method of claim 15 wherein the per-compound oxidizing agent is hydrogen peroxide.

21. The method of claim 20 wherein hydrogen peroxide is present at a level ranging from 0.05 weight % to 7.5 weight % of the total weight of the composition.

22. The method of claim 15 wherein the composition has a pH ranging from 5 to 11.

23. The method of claim 15 wherein the composition further comprises d) a surfactant.

24. The method of claim 23 wherein the surfactant is a nonionic surfactant.

25. The method of claim 15 wherein the composition further comprises d) a corrosion inhibitor.

26. A method of step 2 copper chemical-mechanical planarization, said method comprising the steps of:
  A) placing a substrate comprising copper, at least one dielectric material and at least one barrier material in contact with a polishing pad;
  B) delivering a chemical-mechanical planarization composition comprising
    a) an abrasive;
    b) a ketoxime compound having the structure:
      $R_1$—(C=N—OH)—(C=O)—$R_2$ where $R_1$ and $R_2$ are independently unsubstituted $C_1$-$C_4$ alkyl or substituted $C_1$-$C_4$ alkyl with one or more substituents selected from the group consisting of —OH, —OR, —Cl, —F, —Br, where R is $C_1$-$C_4$ alkyl;
    c) water; and
    d) a per-compound oxidizing agent; and
  C) polishing the substrate with the step 2 copper chemical-mechanical planarization composition.

* * * * *

UNITED STATES PATENT AND TRADEMARK OFFICE
CERTIFICATE OF CORRECTION

PATENT NO.       : 7,316,977 B2                                    Page 1 of 1
APPLICATION NO.  : 11/508427
DATED            : January 8, 2008
INVENTOR(S)      : Junaid Ahmed Siddiqui and Timothy Frederick Compton It is certified that error appears in the above-identified patent and that said Letters Patent is hereby corrected as shown below:

Section (54) Title:
delete the word "KETOOXIME" and insert the word --KETOXIME--

Signed and Sealed this

Eighth Day of July, 2008

JON W. DUDAS
*Director of the United States Patent and Trademark Office*

UNITED STATES PATENT AND TRADEMARK OFFICE
CERTIFICATE OF CORRECTION

PATENT NO. : 7,316,977 B2  Page 1 of 1
APPLICATION NO. : 11/508427
DATED : January 8, 2008
INVENTOR(S) : Junaid Ahmed Siddiqui and Timothy Frederick Compton It is certified that error appears in the above-identified patent and that said Letters Patent is hereby corrected as shown below:

Section (54) and Column 1, line 3, Title:
delete the word "KETOOXIME" and insert the word --KETOXIME--

This certificate supersedes the Certificate of Correction issued July 8, 2008.

Signed and Sealed this

Twenty-ninth Day of July, 2008

JON W. DUDAS
*Director of the United States Patent and Trademark Office*

UNITED STATES PATENT AND TRADEMARK OFFICE
CERTIFICATE OF CORRECTION

PATENT NO.        : 7,316,977 B2              Page 1 of 1
APPLICATION NO.   : 11/508427
DATED             : January 8, 2008
INVENTOR(S)       : Junaid Ahmed Siddiqui and Timothy Frederick Compton It is certified that error appears in the above-identified patent and that said Letters Patent is hereby corrected as shown below:

Title Page

Under Section (73) Assignee:
delete the words "Air Products and Chemicals, Inc." and insert the words --DUPONT AIR PRODUCTS NANOMATERIALS LLC--

Signed and Sealed this

Third Day of February, 2009

JOHN DOLL
*Acting Director of the United States Patent and Trademark Office*